United States Patent
Smith

(12) 
(10) Patent No.: US 6,331,834 B1
(45) Date of Patent: Dec. 18, 2001

(54) WIDEBAND DATA CONVERTER WITH ADAPTIVE SEGMENT SHUFFLING

(75) Inventor: Paul F. Smith, N. Richland Hills, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/675,039

(22) Filed: Sep. 28, 2000

(51) Int. Cl.[7] ...................................... H03M 1/12
(52) U.S. Cl. ........................ 341/155; 341/143; 341/156
(58) Field of Search ................................. 341/155, 143, 341/144, 145, 156, 158, 110, 115, 116, 117, 126

(56) References Cited

U.S. PATENT DOCUMENTS

| | | | |
|---|---|---|---|
| 5,936,562 | * 8/1999 | Brooks et al. | 341/143 |
| 5,982,313 | * 11/1999 | Brooks et al. | 341/143 |
| 6,061,008 | * 5/2000 | Abbey | 341/143 |
| 6,107,947 | * 8/2000 | Lyden | 341/143 |
| 6,124,813 | * 9/2000 | Robertson et al. | 341/143 |

* cited by examiner

*Primary Examiner*—Brian Young
*Assistant Examiner*—John Nguyen
(74) *Attorney, Agent, or Firm*—Charles W. Bethards; R. Louis Breeden; Roland K. Bowler, II

(57) ABSTRACT

A signal converter circuit (10) includes an analog to digital converter (14) for converting an input analog signal into a digital signal. The circuit (10) also includes a DAC 16 with segment shuffler for shuffling the digital signal segments output by the analog to digital converter (14) to improve linearity of the converted digital signal. In addition, a shuffle controller (24) connected to the DAC (16) is for adaptively turning the shuffler of DAC (16) on and off based on a parameter, such as amplitude, of the input analog signal. The adaptive segment shuffling enables a lower performance data converter to be used in devices requiring a high dynamic range for converting signals over a wide range of signal amplitudes.

20 Claims, 2 Drawing Sheets

WIDEBAND DATA CONVERTER WITH ADAPTIVE SEGMENT SHUFFLING

FIELD OF THE INVENTION

The present invention relates generally to wireless telecommunications networks, and more particularly to a data converter for a multi-channel environment with adaptively segment shuffling.

BACKGROUND OF THE INVENTION

In conventional telecommunications systems, system analog to digital converters (ADCs) must receive and digitally convert RF signals over a given dynamic range of amplitudes. The receiver must typically first filter the signals to remove unwanted alias signals and noise outside of the frequency range of interest. Therefore, while ADCs using such signal filtering are suitable for single air interface, single carrier applications, such ADCs are incapable of meeting the stringent requirements of wideband multi-air interface, multi-carrier systems, such as software-defined radios, which must process RF signals over a large dynamic range.

ADCs capable of eliminating non-linearities through segment shuffling, which involves converting the input binary code to a thermometer code and swapping, or re-organizing, the thermometer-coded DAC segments internal to the ADC at each sample point, currently exist. An 8-bit ADC would have 255 thermometer segments along with a 0 segment. If the input code is 00000110, six equally weighted thermometer segments are turned on. Because the six segments are not all the same size due to matching limitations of the manufacturing process, if the same six segments are always used for this input code, then variations in the segment size would translate into signal distortion. However, if a different set of six segments are used each time this code appears, much of the correlation to the input signal is destroyed, and the distortion terms are changed to noise.

While such segment shuffling is desirable for large amplitude RF signals to increase ADC dynamic range, it also increases the noise floor, and therefore increases the difficulty for the ADC of detecting and processing smaller amplitude RF signals. While ADCs could be programmed with segment shuffling to process signals over a wide bandwidth, such ADCs would have to be built to run at higher frequencies. Consequently, the coupling of such higher frequency ADCs would be more difficult to control, noise and distortion would be harder to manage, and overall ADC processing performance would be compromised.

ADCs having segment shuffling that can be turned on or off do exist. However, such ADCs are designed to work with segment shuffling being turned on or off depending upon the particular application. For example, if an ADC is implemented in a communications-type system that processes high amplitude signals, segment shuffling would be turned on to improve signal conversion linearity, as the subsequently increased level of the noise and distortion floor would have minimal impact on the detection and processing of the high amplitude signals. However, if the same ADC is implemented in, for example, a video system, segment shuffling would be turned off to lower the noise floor of the system to enable the ADC to detect and process the lower amplitude video signals. Therefore, while segment shuffling can be turned on or off when the ADC is installed, it has not been adaptively turned on or off based on the detected amplitudes of the signals to be processed by the ADC.

BRIEF DESCRIPTION OF THE DRAWINGS

Additional objects and advantages of the present invention will be more readily apparent from the following detailed description of preferred embodiments thereof when taken together with the accompanying drawings in which:

FIG. 5 is a graph of experimental data for input power versus output power for an ADC circuit including a 5-bit DAC with segment shuffling turned on.

DETAILED DESCRIPTION OF THE PREFERRED EMBODIMENTS

Figure 1:
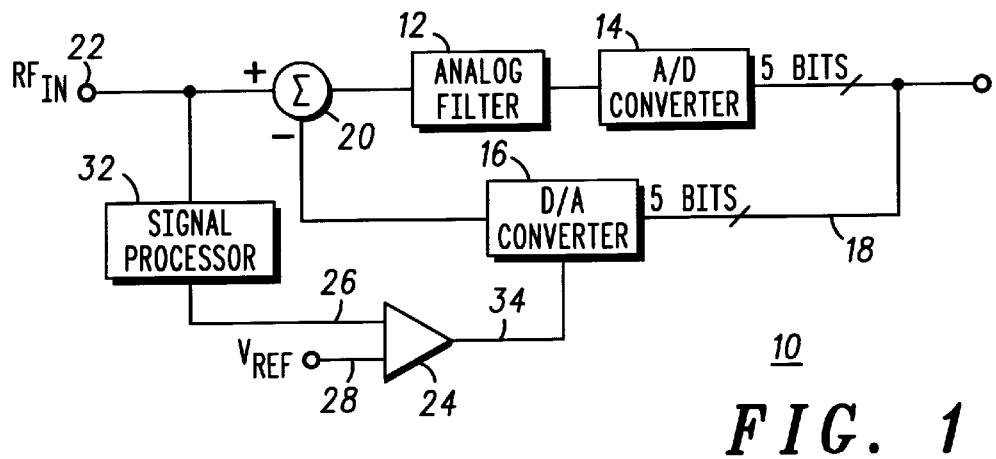
FIG. 1 is a preferred embodiment a block diagram of a sigma-delta ADC circuit incorporating adaptive segment shuffling of a preferred embodiment in accordance with the present invention.

Referring now to the drawings in which like numerals reference like parts, FIG. 1 shows a sigma-delta analog to digital converter (ADC) circuit 10 including on/off data segment shuffling of a preferred embodiment in accordance with the present invention. The ADC circuit 10 includes an analog filter 12, an ADC 14 connected to an output of the analog filter 12, and a digital to analog converter (DAC) 16 with segment shuffling, connected to an output of the ADC 14 via a feedback loop 18 for improving the linearity of the digital signal segments output from the ADC 14 in a manner well known in the art. The circuit 10 also includes a summer 20 for generating difference signals based on differences between analog feedback signals output from the DAC 16 and analog RF signals input into the ADC circuit 10 through a circuit input line 22. Other well-known ADC components, such as an anti-alias filter (not shown) implemented on the input signal line 22 may also be included.

In addition, and in accordance with the preferred embodiment, the ADC circuit 10 also includes a shuffle controller, such as a comparator 24, having a first input line 26 connected to the circuit input line 22 that includes a signal processor 32 for determining a desired parameter, such as signal amplitude, of the input analog RF signal, a second input line 28 connected to an external voltage source (not shown) for receiving a voltage reference signal of, for example, $\frac{1}{32}$ volt, and an output 34 connected to the DAC 16. The comparator 24 is for turning the segment shuffling of the DAC on and off on the fly based on a parameter, such as the above-mentioned signal amplitude, of the analog input signal on line 22 to enable the DAC 16 to adaptively adjust segment shuffling.

The sigma-delta ADC circuit 10 operates as follows. Analog RF signals to be converted are received at the input 22, coupled to the summer 10, the output signal of which is and then filtered by the filter 12 to reduce noise, distortion and other signal transients around a desired signal frequency band. The filtered analog signals are then input into the ADC 14 and converted to digital signals. In the present preferred embodiment, the output digital signals are, for example, 5-bit digital signal segments output for use in communications signal processing in a software-defined radio base station. However, in general the circuit 10 may be configured to process analog signals such as RF communications signals and output digital signal segments of 1-bit or more, depending upon the underlying application.

In addition to being output for communications signal processing, the 5-bit digital signal segments converted by the ADC 14 are also input into the DAC 16. The DAC 16 does or does not perform segment shuffling on the digital signal segments, depending on the signal parameter/ amplitude of the input RF signals and whether segment shuffling command signals are received from the comparator 24, and converts the 5-bit digital signal segments to analog feedback signals. The analog feedback signals are then input to the summer 20, which generates analog difference signals based on the difference between the analog feedback signals and the input analog signals. The difference signals are then input into the filter 12 that is used for shaping away quantization noise from the signal of interest, as is known in the art.

In addition to being input to the summer 20, the input analog signals are also input into the signal processor 32. The signal processor then determines and outputs the necessary signal parameter, such as signal amplitude, in signal form to the comparator 24 via the input signal line 26. The comparator 24 compares this amplitude or other parameter of the input analog signal to the reference voltage. If the amplitude of the input analog signal is above the amplitude of the reference signal, the comparator 24 outputs a command signal to the DAC 16 that turns on segment shuffling for corresponding digital signals input into the DAC. If the amplitude of the input analog signal is below the reference voltage, the comparator 24 outputs a command signal to the DAC 16 that turns off segment shuffling for the corresponding digital signal segments input into the DAC 16. As a result of this adaptive control of segment shuffling, the dynamic range of the ADC circuit is maximized both for large and small amplitude RF signals.

Figure 2:
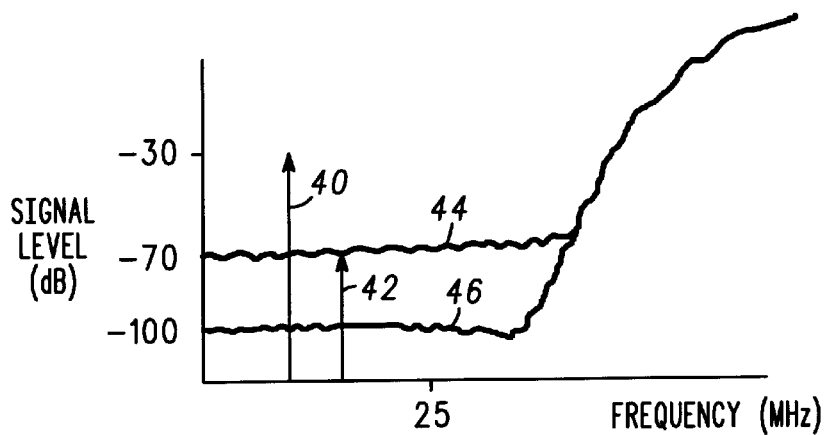
FIG. 2 is a graph of input signal amplitude versus signal frequency as well as noise amplitude versus frequency for large amplitude signals processed by the sigma-delta ADC circuit of FIG. 1.
Figure 3:
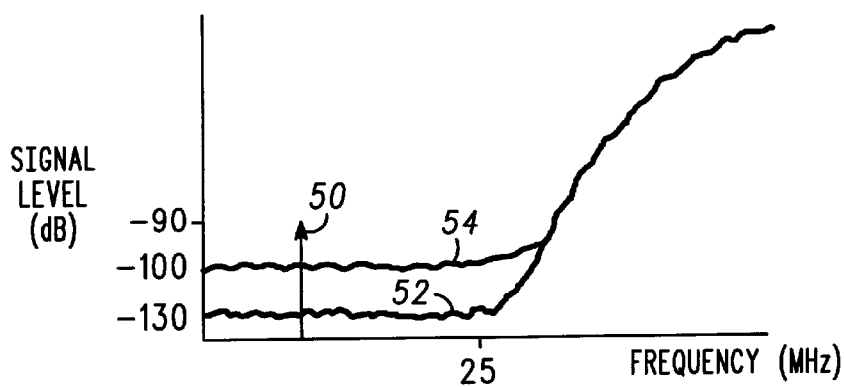
FIG. 3 is a graph of input signal amplitude versus signal frequency as well as noise amplitude versus frequency for a small amplitude signal processed by the sigma-delta ADC circuit of FIG. 1.

Referring now to FIGS. 2 and 3, the effects of segment shuffling on both large and small amplitude signals will be discussed. FIG. 2 illustrates the signal level of a relatively large amplitude signal 40 and a relatively small signal 42 in an exemplary digital signal spectrum of the ADC circuit 10, as well as associated noise/distortion levels at 44, 46 when segment shuffling at the DAC 16 is turned off and on, respectively. As the signal 40 has a signal level of −30 dB and the signal 42 has a signal level of −70 dB, the dynamic range over which the ADC 14 must process signals is 40 dB. When segment shuffling is turned off, a distortion level 44 associated with the ADC 14 for signals at these levels also has a signal level of −70 dB, and therefore may corrupt the integrity of the small signal 42. However, if segment shuffling at the DAC 16 is turned on for this higher level signal, a distortion level 46 is decreased in the vicinity of the signals 40, 42 to, for example, −100 dB, thereby increasing the ADC dynamic range beyond 70 dB and ensuring that the distortion does not compromise the ability of the ADC 14 to convert the signal 42. Consequently, the reference signal on the second input line 28 is set so that the signals 40, 42 would cause the comparator 24 to send a command signal to the DAC to turn on segment shuffling.

FIG. 3 illustrates the signal levels of a relatively small amplitude signal 50 in another exemplary digital signal spectrum of the ADC circuit 10, as well as associated noise/distortion levels at 52, 54 when segment shuffling at the DAC 16 is turned off and on, respectively. As the signal 50 has a signal level of −90 dB, and a distortion level 52 associated with the ADC 14 for signals at this lower level with segment shuffling turned off is −130 dB, the dynamic range over which the ADC 14 must process signals is 40 dB, which is the same dynamic range as shown in FIG. 2. When segment shuffling is turned on, however, a distortion level 54 associated with the ADC 14 for signals at this lower level is increased in the vicinity of the lower amplitude signal 50 to, for example, −100 dB (the same as the distortion level 46), thereby decreasing the ADC dynamic range to 10 dB. Consequently, the reference signal on the second input line 28 is set so that the signal 50 would not cause the comparator 24 to turn on segment shuffling at the DAC 16.

Figure 4:
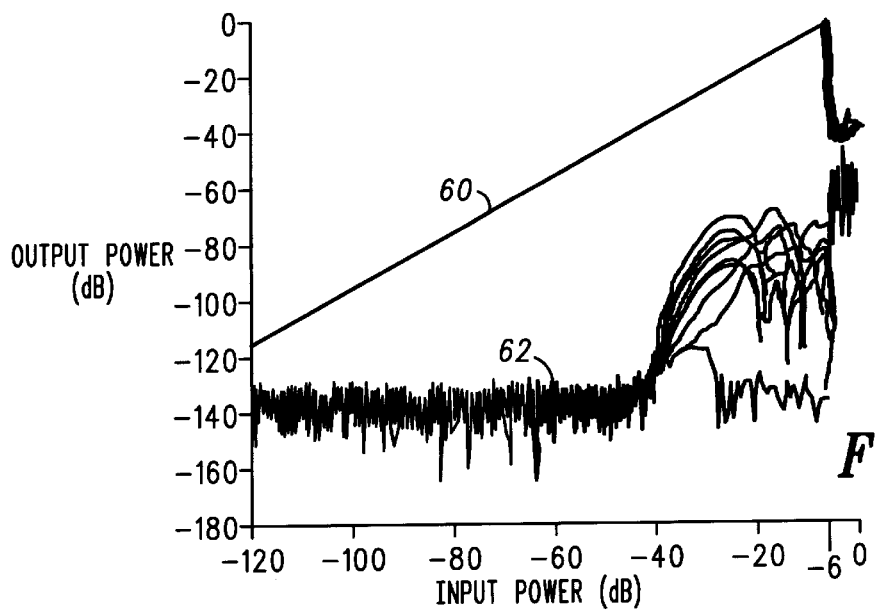
FIG. 4 is a graph of experimental data for input power versus output power for an ADC circuit including a 5-bit DAC with segment shuffling turned off.
Figure 5:
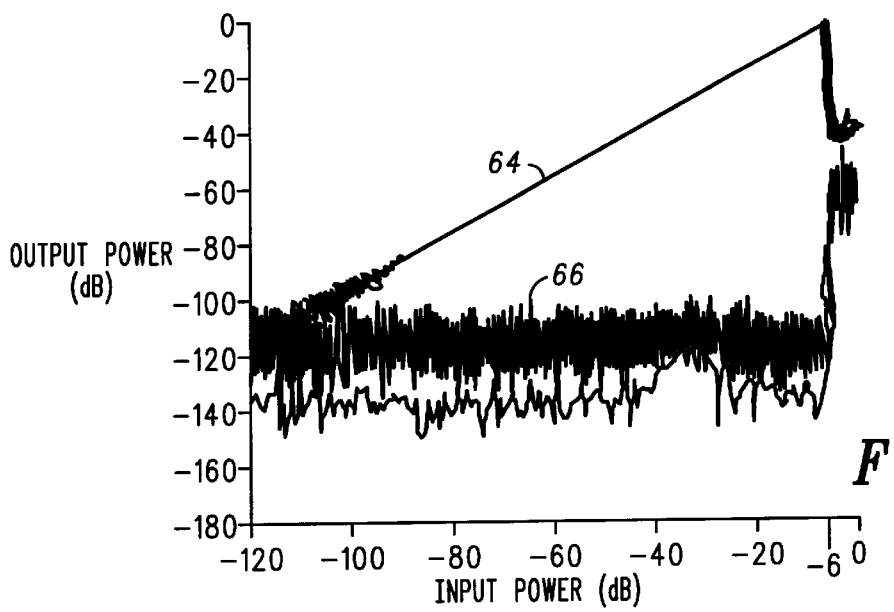

FIGS. 4 and 5 illustrate the results of simulated data conversion experiments performed both with and without adaptive segment shuffling, respectively. As shown in FIG. 4, the amplitude of the output signal 60 is shown as well as the amplitude of the attendant noise and distortion 62 of the ADC. For input signals below −40 dB, the noise and distortion 62 is about −130 dB. However, for input signals larger than −40 dB, the noise and distortion 62 increases to about −70 dB.

FIG. 5 shows the same data when segment shuffling is turned on. The noise and distortion 66 is independent of the input level and has an amplitude of about −100 dB. Such an amplitude is much higher than the noise and distortion 62 in FIG. 4 for signals below −40 dB, but is much lower than the noise and distortion 62 for signals above −40 dB. Therefore, in accordance with the present preferred embodiment, the lowest noise and distortion can be obtained for all signal levels by turning segment shuffling off for low signals and turning segment shuffling on for large signals.

Figure 6:
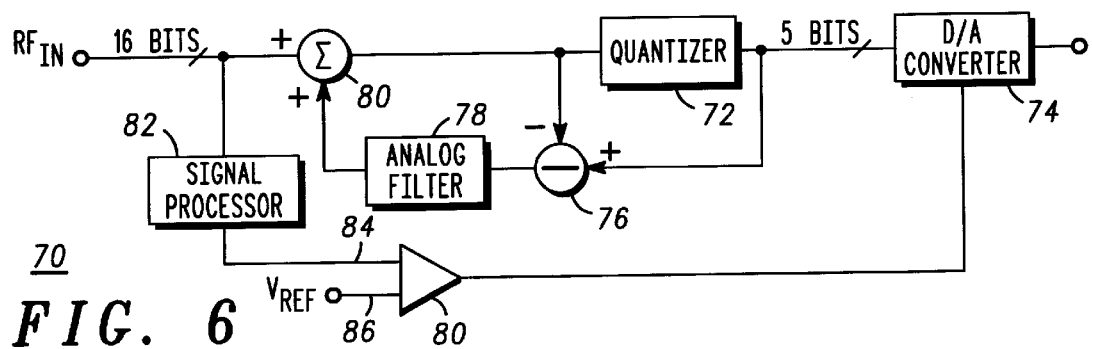
FIG. 6 is a further preferred embodiment block diagram of a sigma-delta DAC incorporating adaptive segment shuffling in accordance with the present invention.

While segment shuffling has been described above in connection with an ADC circuit, it should also be appreciated that adaptive segment shuffling can likewise be implemented in a DAC circuit in a similar manner and with similar results. FIG. 6 shows an exemplary DAC circuit 70 including segment shuffling pursuant to another preferred embodiment in accordance with the present invention. The circuit 70 includes a quantizer 72 that only sends the 5 most significant bits to a DAC 74. The error caused by this 5-bit quantization is determined by a subtraction circuit 76, is filtered by a filter 78, and is then output to a signal summer 80, which functions in a manner similar to the signal summer 20 shown in FIG. 1, albeit in the digital domain. This well-known circuit configuration enables the DAC 74 to function as a sigma-delta DAC for converting the 5-bit digital signal to an analog signal through well-known conversion techniques.

The circuit 70 also includes a shuffle controller, such as a comparator, 80 that functions in a manner similar to the shuffle controller 24 in FIG. 1, albeit in the digital domain. Specifically, the comparator 80 compares the amplitude of a 16-bit input signal as determined by a signal processor 82 and received at a first input 84, to a reference voltage level received at a second input 86. In a preferred to embodiment, this reference level is set to equal the level of the least significant bit of the 5-bit DAC 74. If the amplitude, for example, of the input signal is above the reference level, thereby indicating that the 16-bit input signal is large enough so that its 5 most significant bits are changing, then the comparator 80 outputs a command to the DAC to turn on segment shuffling during data conversion. If the amplitude of the input signals is below the reference level, thereby indicating that the 16-bit input signal is small enough so that its five most significant bits do not change, then the comparator 80 outputs a command to the DAC 74 to turn off segment shuffling. Therefore, segment shuffling can be adaptively controlled based on the amplitude of the input digital signal.

In view of the foregoing discussion, it should be appreciated that the adaptive segment shuffling as implemented in the above-described preferred embodiments enables lower performance converters to be used in telecommunications devices, such as software defined radio base stations, requiring a high dynamic range to convert signals over a wide range of amplitudes. In addition, it is contemplated that the adaptive segment shuffling could also be utilized in other devices, such as hi-fidelity audio components and video converters, requiring high linearity and low noise and distortion parameters.

While the above description is of the preferred embodiment of the present invention, it should be appreciated that the invention may be modified, altered, or varied without deviating from the scope and fair meaning of the following claims.

What is claimed is:

1. A signal converter for a wideband communications device, comprising:
   an analog to digital converter for converting an input analog signal into digital signal segments;
   a segment shuffler for shuffling the digital signal segments output by the analog to digital converter to improve linearity of the digital signal segments; and
   a shuffle controller connected to the segment shuffler for adaptively turning the shuffler on and off based on at least one parameter of the input analog signal.

2. The signal converter of claim 1, wherein the converter is implemented in a software-defined radio base station.

3. The signal converter of claim 1, wherein the at least one parameter comprises an amplitude of the input analog signal.

4. The signal converter of claim 3, wherein the shuffle controller comprises a comparator for receiving the input analog signal at a first input and a reference signal at a second input, for outputting a first shuffle control signal to turn on the segment shuffler if the parameter of the input analog signal is greater than the reference signal, and for outputting a second shuffle control signal to turn off the segment shuffler if the parameter of the input analog signal is less than the reference signal.

5. The signal converter of claim 4, wherein the reference signal comprises a threshold voltage reference corresponding to a least significant bit of the output first or second shuffle control signals.

6. The signal converter of claim 1, wherein the analog to digital converter is implemented as a sigma-delta architecture.

7. The signal converter of claim 6, wherein the filter is also for operating as a bandpass filter for filtering noise from a difference signal before inputting the difference signal to the analog to digital converter.

8. A signal converter for a wideband communications device, comprising:
   a digital to analog converter for converting digital signal segments of an input digital signal into an analog signal, the digital to analog converter including a segment shuffler for shuffling the digital signal segments during signal conversion to improve output signal linearity; and
   a shuffle controller connected to the digital to analog converter for adaptively turning the segment shuffler on and off based on at least one parameter of the digital signal.

9. The signal converter of claim 8, wherein the converter is implemented in a software-defined radio base station.

10. The signal converter of claim 8, wherein the at least one parameter of the digital signal comprises an amplitude of the digital signal.

11. The signal converter of claim 8, wherein the digital to analog converter is implemented with a sigma-delta architecture.

12. The signal converter of claim 11, wherein the shuffle controller comprises a comparator for receiving a parameter of the input digital signal at a first input and a reference signal at a second input, for outputting a first shuffle control signal to turn on the segment shuffler if the parameter of the input digital signal is greater than the reference signal, and for outputting a second shuffle control signal to turn off the segment shuffler if the parameter of the input digital signal is less than the reference signal.

13. The signal converter of claim 12, wherein the predetermined reference signal comprises respective least significant bit values of the digital signal segments input into the digital to analog converter.

14. A signal conversion method, comprising:
   receiving an analog signal to be converted;
   determining a waveform parameter of the analog signal;
   converting the analog signals to a digital signal using segment shuffling;
   turning on the segment shuffling if the waveform parameter of the analog signal is above a predetermined threshold level; and
   turning off the segment shuffling if the waveform parameter of the analog signal is below the predetermined threshold;
   wherein the turning on and the turning off of the segment shuffling is executed on the fly.

15. The signal conversion method of claim 14, wherein the predetermined threshold level is a least significant bit of the converted digital signal.

16. The signal conversion method of claim 14, wherein the converting of the analog signal to a digital signal using segment shuffling comprises converting the analog signal to a digital signal using a data converter having a sigma-delta architecture.

17. The signal conversion method of claim 16, wherein the turning on and the turning off of the segment shuffling comprises:
   outputting a first shuffle control signal to turn on the segment shuffling if the input analog signal is greater than a predetermined reference signal, and
   outputting a second shuffle control signal to turn off the segment shuffling if the input analog signal is less than the predetermined reference signal.

18. A signal conversion method, comprising:
   receiving a digital signal to be converted;
   determining the amplitude of the digital signal;
   converting the digital signal to an analog signal using segment shuffling;
   turning on the segment shuffling if a signal parameter of the digital signal is above a predetermined threshold; and
   turning off the segment shuffling if the signal parameter of the digital signal is below a predetermined threshold;
   wherein the turning on and the turning off of the segment shuffling is executed on the fly.

19. The signal converter of claim 18, wherein the converting of the digital signal to an analog signal using segment shuffling comprises converting the digital signal to an analog signal using a data converter having a sigma-delta architecture.

20. The signal converter of claim 18, wherein the predetermined threshold is a least significant bit of the digital signal to be converted; and wherein the turning on and turning off of the segment shuffling comprise turning on the segment shuffling if the parameter of the digital signal is greater than a predetermined threshold, and for turning off the segment shuffling if the parameter of the digital signal is less than the predetermined threshold.

* * * * *